United States Patent [19]

Chellis et al.

[11] Patent Number: 4,704,791

[45] Date of Patent: Nov. 10, 1987

[54] PROCESS FOR PROVIDING A LANDLESS THROUGH-HOLE CONNECTION

[75] Inventors: LeRoy N. Chellis, Endwell; Theron L. Ellis, Vestal, both of N.Y.

[73] Assignee: International Business Machines Corporation, Armonk, N.Y.

[21] Appl. No.: 836,376

[22] Filed: Mar. 5, 1986

[51] Int. Cl.$^4$ ............................................. H01K 3/10
[52] U.S. Cl. ...................................... 29/852; 427/97
[58] Field of Search ................... 29/852, 846; 427/97; 204/15

[56] References Cited

U.S. PATENT DOCUMENTS

| | | | |
|---|---|---|---|
| 2,986,804 | 6/1961 | Greenman et al. | 29/852 |
| 3,163,588 | 12/1964 | Shortt et al. | 29/852 X |
| 4,354,895 | 10/1982 | Ellis | 156/631 |
| 4,604,799 | 8/1986 | Gurol | 29/852 X |

FOREIGN PATENT DOCUMENTS

| | | | |
|---|---|---|---|
| 664222 | 6/1963 | Canada | 427/97 |
| 2307438 | 11/1976 | France | 29/852 |
| 854881 | 11/1960 | United Kingdom | 427/97 |

OTHER PUBLICATIONS

IBM Tech Disclosure Bull., vol. 22, No. 10, Mar. 1980, p. 4468 by Bupp et al.
IBM Technical Disclosure Bulletin, vol. 9, No. 10, Mar. 1967, Crimi, et al., "Landless Hole Circuit Card", pp. 1310-1311.
IBM Technical Disclosure Bulletin, vol. 13, No. 1, Jun. 1970, Mead, "Landless Plated Through-Hole Process", p. 181.
IBM Technical Disclosure Bulletin, vol. 15, No. 10, Mar. 1973, Chumbres, et al., "Landless Plated-Through Hole Photoresist Masking Process", pp. 3298-3299.
IBM Technical Disclosure Bulletin, vol. 27, No. 5, Oct. 1984, Chellis, et al., "Signal Core by Direct Circuit Deposition", pp. 2829-2930.

Primary Examiner—Howard N. Goldberg
Assistant Examiner—Carl J. Arbes
Attorney, Agent, or Firm—Pollock, Vande Sande & Priddy

[57] ABSTRACT

At least two conductors are electrically connected through a dielectric material by providing a dielectric material having a first conductor on a first surface thereof and a temporary support layer covering the first conductor and the first surface of the dielectric material.

A second surface on the dielectric material opposite the first surface is provided with a second conductor and a temporary support layer covering the second conductor and second surface of the dielectric material.

Interstitial through-holes are provided to connect the first and second conductors. The through-holes are plated with an electrical conductor to thereby electrically connect the first and second conductors. The support layers are then mechanically removed such as by peeling to thereby provide a landless electrical connection between the first and second electrical conductors.

12 Claims, 4 Drawing Figures

PROCESS FOR PROVIDING A LANDLESS THROUGH-HOLE CONNECTION

TECHNICAL FIELD

The present invention is concerned with a process for connecting at least two conductors through a dielectric material. In particular, the present invention is concerned with a process for providing landless plated through-holes in a dielectric material.

BACKGROUND ART

In the manufacture of printed circuit cards and boards, a dielectric sheet material is employed as the substrate. A conductive circuit pattern is provided on one or both of the major surfaces of the substrate.

In order to provide electrical connection between layers, metal coated through-holes are provided. In providing a connection of conductive patterns through a dielectric material, to a large extent, a conductive land and line are provided on the surface of the dielectric material. However, the presence of a land is undesirable on the dielectric material since it takes up valuable area on the dielectric material which could be used for other purposes.

Accordingly, techniques have been suggested for providing landless through-hole connections. Such techniques include those suggested by Crimi, et al. in IBM Technical Disclosure Bulletin, Vol. 9, No. 10, March 1967; Mead, IBM Technical Disclosure Bulletin, Vol. 13, No. 1, June 1970; and Chumbres, et al., IBM Technical Disclosure Bulletin, Vol. 15, No. 10, March 1973.

These suggested techniques, for the most part, require some photoresist process to define the desired circuitry and/or to protect circuitry already present after the through-holes have been provided. This necessity to protect areas significantly complicates the process.

SUMMARY OF INVENTION

The present invention is concerned with a process for connecting at least two conductors through a dielectric material. In particular, the present invention is concerned with providing a landless through-hole connection.

The process of the present invention includes providing a dielectric material having a first electrically conductive pattern on a first major surface thereof. A temporary support layer that covers the first electrically conductive pattern and the first major surface of the dielectric material is provided.

A second major surface of the dielectric material opposite the first major surface of the dielectric material is provided with a second electrically conductive pattern.

In addition, covering the second electrically conductive pattern and the second major surface of the dielectric material is a temporary support layer.

Next, interstitial through-holes connecting the first electrically conductive pattern and the second electrically conductive pattern are provided. The through-holes are plated with an electrical conductor in order to electrically connect the first electrically conductive pattern with the second electrically conductive pattern.

The support layers are then removed by peeling to thereby provide a landless electrical connection between the first and second electrically conductive pattern.

BEST AND VARIOUS MODES FOR CARRYING OUT INVENTION

Figure 1:
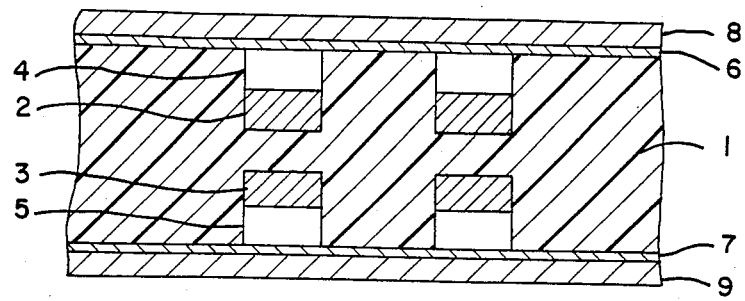
FIGS. 1-4 are schematic diagrams illustrating the method of the present invention for fabricating the landless through-hole connection.

The present invention is concerned with providing electrical connection between at least two conductive patterns through a dielectric material.

The process of the present invention provides for what is referred to as landless through-hole electrical connection.

In accordance with the present invention, a first electrically conductive pattern is provided on a support carrier or layer. The support layer is one which is temporary and is capable of being peeled away from the dielectric material in a subsequent step without altering the conductive pattern provided.

Such support layers are commercially available and include those under the trade designation Double Thin Film from Yates Industries. Such materials generally have an electrolytically formed copper or copper-containing layer and a second electrolytically formed copper layer of a thickness which is not self-supporting.

The copper layer and the second metal layer are separated by a coating of a release agent. Examples of release layers are chromium, lead, nickel, aluminum, and silver. The release coating allows for a subsequent electrodeposition of an ultra-thin copper layer thereon and also allows that the support layer be mechanically stripped from the laminate without tearing. Other temporary removable support layers such as aluminum can be employed if desired.

The desired electrically conductive pattern can be provided on the temporary support member and particularly on the thin copper surface of the preferred temporary support members disclosed hereinabove. This can be accomplished by applying a photoresist material to the thin copper side of the temporary support member, exposing such to actinic radiation and developing to provide the desired pattern by leaving exposed those areas of the thin copper which characterize the desired pattern.

Next, copper is plated to the desired thickness onto the thin copper to provide the electrically conductive pattern.

The remaining photoresist material is removed by dissolving in a suitable solvent.

The portions of the thin copper layers 4 and 5 that were coated by the photoresist material are then removed by flash etching.

The flash etching is achieved by contacting the structure with an etchant. Suitable etchants for copper include solutions of cupric chloride, ferric chloride, sodium peroxydisulfate, ammoniacal chlorite, ammoniacal persulfate, and nitric acid. Since these copper layers to be removed are very thin, contact with the etchant need only be for about 1 to about 2 minutes. The temperature of the flash etching is usually about 110° F. to about 140° F.

The same procedure can be employed to provide the other electrically conductive pattern which is to be present on another major surface of the dielectric material.

The desired temporary support layers having the desired electrically conductive patterns thereon are then registered on locating pins, as well-known in the art and are laminated together with the dielectric material intermediate to the patterns. The laminating is carried out so that the surface of the desired electrically conductive pattern located on the temporary support member is adjacent to and contacting the dielectric material. At least two electrically conductive patterns are laminated to different major surfaces of the dielectric material.

Dielectric substrates or materials employed in accordance with the present invention include thermoplastic and thermosetting resins. Typical thermosetting resinous materials include epoxy, phenolic-based materials, and polyamides. Such materials are usually molded of the resinous material along with a reinforcing agent such as being a glass-filled epoxy or phenolic-based material. Examples of some phenolic-type materials include copolymers of phenol, resorcinol, and cresol. Examples of some suitable thermoplastic polymeric materials include polyolefins such as polypropylene, polysulfones, polycarbonates, nitrile rubbers, and ABS polymers.

The preferred polymeric materials employed in accordance with the present invention are epoxy resinous materials. Typical epoxy resins include the bisphenol A type resins obtained from bisphenol A and epichlorohydrin, resinous materials obtained by the epoxidation of novolak resins produced from a phenolic material such as phenol and an aldehyde such as formaldehyde with epichlorohydrin, polyfunctional epoxy resins such as tetraglycidyldiaminodiphenyl methane and alicyclic epoxy resins such as bis(3,4-epoxy-6-methyl-cyclohexyl methyl) adipate. The most preferred epoxy employed is of the bisphenol A type.

The epoxy resinous compositions also can contain accelerating agents and curing agents as well-known in the art. Examples of suitable curing agents include polyamines, primary, secondary, and tertiary amines, polyamides, polysulfides, urea-phenol-formaldehyde, and acids or anhydrides thereof. In addition, suitable curing agents include Lewis acid catalysts such as $BF_3$ and complexes thereof.

Many of the dielectric substrates employed in accordance with the present invention are referred to as so-called prepreg substrates which contain a resin and a reinforcing fiber such as fiberglass. Such compositions containing fibers are usually prepared by impregnating the fibers with, for instance, an epoxy polymer composition. The amount of the epoxy composition is usually about 30% to about 70% by weight and preferably about 50% to about 65% by weight of the total solids content of the epoxy composition in the fiberglass.

After combining with the resinous fibers the composition is cured to the B-stage and cut to the desired shape such as a sheet. When sheets are employed, the thickness is usually about 1.5 mils to about 8 mils. The curing to the B-stage is generally achieved by using temperatures of about 80° C. to about 110° C. for about 3 minutes to about 10 minutes.

If desired, the substrate can then be laminated onto other substrates as well as being interposed between the above electrically conductive patterns present in the temporary support layers.

The laminating can be carried out by pressing together the desired structure in a preheated laminating press at a predetermined pressure and temperature as, for example, about 200 psi to about 500 psi and preferably about 250 psi to about 300 psi at about 180° C. The time of the pressing operation is variable depending upon the particular materials employed and the pressure applied. About 1 hour is adequate for the above conditions.

Next, in order to connect the electrically conductive patterns on opposing surfaces of the dielectric material, the required through-holes in the structure are made. The through-holes can be obtained by drilling or punching operations including mechanical drilling and laser drilling.

After the interstitial through-holes are obtained, the dielectric substrate with the through-holes is suitably cleaned and preconditioned for subsequent plating therein.

For instance, the preconditioning can include creation of active sites by physical means such a sand and/or vapor blasting and/or chemical methods such as solvent swelling. A typical solvent is N-methyl pyrrolidone.

The interstitial holes upon which the metal is to be plated for electrical connection between the electrically conductive patterns on opposing surfaces of the dielectric substrate must be catalytic for the deposition of the copper.

For instance, a suitable catalyst is deposited in the through-holes prior to contact with an electroless copper plating bath.

Among the more widely employed procedures for catalyzing or seeding a substrate is the use of a stannous chloride sensitizing solution and a palladium chloride activator to form a layer of metallic palladium particles.

For instance, one method for catalyzing a dielectric substrate is exemplified by U.S. Pat. No. 3,011,920 which includes sensitizing the substrate by treating it with a solution of colloidal metal, accelerating the treatment with a selective solvent to remove protective colloids from the sensitized dielectric substrate, and then electrolessly depositing the copper onto the sensitized substrate.

Also, as suggested, for example, in U.S. Pat. No. 3,099,608, a dielectric substrate can be pretreated by depositing a thin film of "conductivator" type metal particles such as palladium metal from a semi-colloidal solution onto the dielectric substrate to provide a conducting base which permits electroplating with a conductive metal on the "conductivated" base.

Moreover, U.S. Pat. No. 3,632,388 suggests a method for treating a polymeric plastic substrate in the plating process which utilizes a preliminary chromic acid etch followed by one-step activation with a tin-palladium hydrosol.

More recently, U.S. Pat. No. 4,066,809 discloses the use of a so-called triple seeding technique. This technique includes contacting the surfaces of the dielectric substrate first with a stannous chloride sensitizing solution, then with a palladium chloride activator, and then with a palladium chloride/stannous chloride/hydrochloride acid seeder bath.

In addition, prior to the stannous chloride and palladium chloride treatment, the substrate and through-holes can be treated with an aqueous solution containing a multifunctional ionic polymer, as disclosed in U.S. Pat. No. 4,478,883 to Bupp, et al. and U.S. patent application Ser. No. 696,879 to Bupp, et al., disclosures of which are incorporated herein by reference.

The polymer is a multifunctional ionic material in that it contains at least two active or available ionic functional moieties of the same polarity. The polymers are at least water miscible and are preferably water soluble or at least soluble in the water compositions employed in the present invention. The preferred ionic moieties are cationic moieties such as quaternary phosphonium and quaternary ammonium groups. Polymers containing at least two ionic moieties are commercially available and need not be described herein in any detail. Examples of commercially available multifunctional cationic polymers are Reten 210, Reten 220, and Reten 300, available from Hercules, disclosures of which can be found in "Water Soluble Polymers", Bulletin VC-482A, Hercules Incorporated, Wilmington, Del. 19899, disclosure of which is incorporated herein by reference.

The Reten polymers are high molecular weight polymers (usually about 50,000 to about 1,000,000 or more) and have a main chemical backbone of polyacrylamide.

The ionic polymer is usually employed as a dilute aqueous solution of about 0.01% to about 1% by weight and more usually about 0.05% to about 0.5% by weight of the copolymer. The aqueous solution usually contains an inorganic acid such as $H_2SO_4$ or HCl to provide a pH of about 0 to about 7 and more usually a pH of about 0 to about 3. The acid is usually present in amounts of about 2% to about 10% by weight.

The treatment with the ionic polymer is generally about 1 minute to about 10 minutes.

After treating with the ionic polymer, if desired, the structure can be rinsed such as with deionized water in order to remove any excess polymer not absorbed in the through-holes.

Next, the through-holes are activated by contact with a composition containing a catalytic composition capable of initiating the electroless copper plating process. The compositions containing metal which can directly provide the catalytic sites or serve as a precursor which leads to the catalytic sites. The metal present may be in the elemental form, an alloy, or compound, or mixtures thereof. The preferred metal catalysts are precious metals such as gold, palladium, and platinum. In addition, it is possible to employ non-precious metals such as copper, nickel, cobalt, iron, zinc, manganese, and aluminum.

The most preferred catalyst is palladium. A typical palladium composition contains about 1.2 to about 2.5 grams per liter of a palladium salt which is preferably $PdCl_2$, about 80 to about 150 grams per liter of a stannous salt which is preferably $SnCl_2.2H_2O$, and about 100 to about 150 milliliters per liter of an acid which is preferably HCl. When HCl is provided in the form of a 37% HCl solution, about 280 to about 360 milliliters of the HCl solution is preferably employed.

The most preferred composition contains about 1.5 grams per liter of $PdCl_2$ and about 280 milliliters per liter of 37% HCl. The composition is usually maintained at a temperature of about 65° F.±10° F.

A typical triple seeder process is disclosed, for instance, in U.S. Pat. No. 4,525,390 to Alpaugh, et al., disclosure of which is incorporated herein by reference.

Next, the through-holes are plated with an electrically conductive metal such as nickel or copper by contacting the structure with an electroless plating bath.

The preferred metal employed is copper. Suitable copper electroless plating baths and their method of application are disclosed in U.S. Pat. Nos. 3,844,799 and 4,152,467, disclosures of which are incorporated herein by reference.

The copper electroless plating bath is generally an aqueous composition which includes a source of cupric ion, a reducing agent, a complexing agent for the cupric ion, and a pH adjustor. The plating baths also can contain a cyanide ion source and a surface-active agent.

The cupric ion source generally used is a cupric sulfate or a cupric salt of the complexing agent to be employed. When employing cupric sulfate, it is preferred to use amounts from about 3 to about 15 grams per liter and most preferably from about 8 to about 12 grams per liter.

The most common reducing agent employed is formaldehyde which is generally used in amounts from about 0.7 to about 7 grams per liter and more usually about 0.7 to about 2.2 grams per liter. Examples of some other reducing agents include formaldehyde precursors or derivatives such as paraformaldehyde, trioxane, dimethyl hydantoin, and glyoxal; borohydrides such as alkali metal borohydrides (sodium and potassium borohydride) and substituted borohydrides such as sodium trimethoxy borohydride; and boranes such as amine borane, isopropyl amine borane, and morpholine borane. Hypophosphite reducing agents can also be used for electroless nickel and copper plating.

Examples of some suitable complexing agents include Rochelle salts, ethylene diamine tetraacetic acid, the sodium (mono-, di-, tri-, and tetra-sodium) salts of ethylene diamine tetraacetic acid, nitrilo tetraacetic acid and its alkali salts, gluconic acid, gluconates, triethanol amine, glucono(gamma)-lactone, modified ethylene diamine acetates such as N-hydroxy ethyl ethylene diamine triacetate. A number of other suitable cupric complexing agents are suggested in U.S. Pat. Nos. 2,996,408; 3,075,855; 3,075,856; and 2,938,805. The amount of cupric ions present in the solution is generally from about 20 to about 50 grams per liter or in a 3-4 fold molar access.

Moreover, the plating bath generally contains a surfactant which assists in wetting the surfaces to be coated. A satisfactory surfactant is, for instance, an organic phosphate ester, available under the trade designation Gafac RE-610. Generally, the surfactant is present in amounts from about 0.02 to about 0.3 grams per liter. In addition, the pH of the bath is also usually controlled, for instance, by the addition of a basic compound such as sodium hydroxide or potassium hydroxide in the desired amount to achieve the desired pH. The preferred pH of electroless copper plating baths is usually between about 11.6 and about 11.8.

Moreover, the plating bath can also include a cyanide ion and most usually about 10 to about 25 milligrams per liter to provide a cyanide ion concentration in the bath within the range of about 0.0002 to about 0.0004 molar. Examples of some cyanides include the alkali metal, alkine earth metal, and ammonium cyanides.

The specific gravity of such plating baths is generally in the range of about 1.060 to about 0.080. Moreover, the temperature of the copper electroless plating baths is usually between about 70° C. and about 80° C. and more usually between about 70° C. and about 75° C. For a discussion of suitable plating temperatures along with cyanide ion concentration discussion see U.S. Pat. No. 3,844,799.

After the through-holes are plated to provide electrical connection between the electrically conductive patterns on opposing surfaces of the dielectric substrate, the temporary support layer is mechanically removed or stripped, such as by peeling from the structure, taking along with it the separating layer.

To further illustrate the present invention, reference is made to FIGS. 1–4.

FIG. 1 illustrates the laminate containing the electrically conductive patterns on opposing major surfaces of the dielectric substrate. In particular, numeral 1 represents the dielectric substrate, numerals 2 and 3 represent the electrically conductive first and second patterns respectively. Numerals 4 and 5 represent the thin copper layer previously plated onto the support layer. Numerals 6 and 7 represent a separating layer such as a chrome separating layer. Numerals 8 and 9 represent the temporary support layer such as 2 ounce carrier copper.

Figure 2:
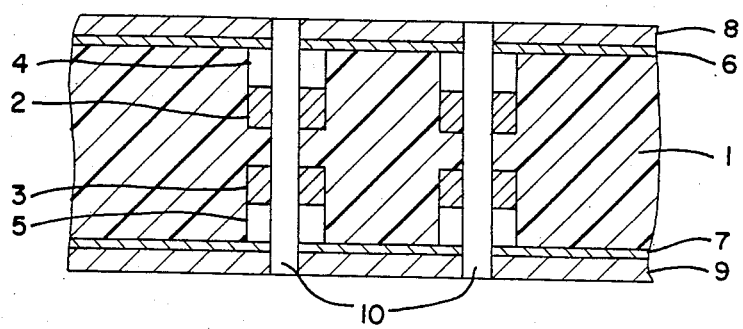

In FIG. 2 is shown the through-holes represented by numeral 10.

Figure 3:
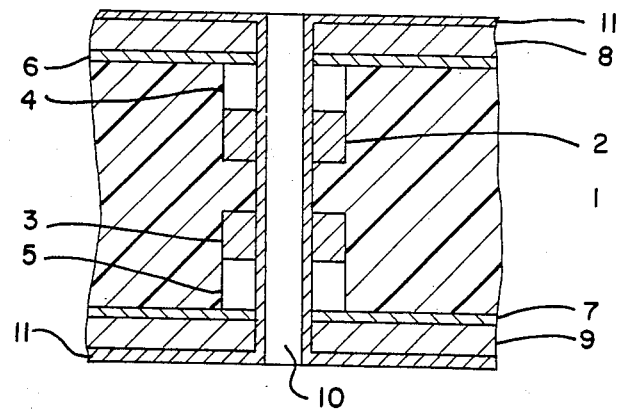

FIG. 3 illustrates the electrically conductive metal plated on the through-holes represented by numeral 11.

Figure 4:
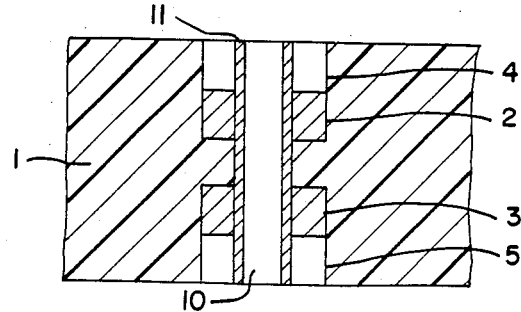

FIG. 4 shows the structure after removal of the temporary support layer.

Having thus described our invention, what we claim as new and desire to secure by Letters Patent is:

1. A process for connecting at least two electrically conductive patterns through a dielectric material by a landless electrical connection which comprises:
    A. providing a dielectric material having a first electrically conductive pattern on a first major surface thereof and a temporary support layer covering said first electrically conductive pattern and said first major surface of said dielectric material;
    B. providing on a second major surface of said dielectric material opposite said first major surface thereof a second electrically conductive pattern and a temporary support layer covering said second electrically conductive pattern and said second major surface of said dielectric material;
    C. providing interstitial through-holes connecting said first electrically conductive pattern and said second electrically conductive pattern;
    D. plating said through-holes with an electrical conductor to thereby electrically connect said first electrically conductive pattern with said second electrically conductive pattern; and
    E. removing both of the support layers by peeling to thereby provide a landless electrical connection between the first and second electrically conductive pattern.

2. The process of claim 1 wherein intermediate to the temporary support layers and the electrically conductive patterns are provided release layers for permitting mechanical stripping of the support layers without damaging the electrically conductive patterns.

3. The process of claim 2 wherein said support layers are of copper and said release layers are of chrome.

4. The process of claim 1 wherein said holes are provided by drilling.

5. The process of claim 1 wherein said dielectric substrate comprises an epoxy resin.

6. The process of claim 5 wherein said dielectric substrate further includes fiberglass.

7. The process of claim 1 wherein copper is plated in said through-holes.

8. The process of claim 1 which further comprises providing the first and second electrically conductive patterns by providing on each of the temporary support layers a desired electrically conductive pattern, registering each of the temporary support layers with the dielectric material intermediate the temporary layers with the desired electrically conductive patterns adjacent to and contacting the dielectric material, and laminating together the temporary support layers and dielectric material located intermediate the patterns.

9. The process of claim 8 wherein said temporary support layers are electrically conductive.

10. The process of claim 8 wherein said temporary support layers are selected from the group of copper and aluminum.

11. The process of claim 1 wherein said temporary support layers are electrically conductive.

12. The process of claim 1 wherein said temporary support layers are selected from the group of copper and aluminum.

* * * * *